US008886487B2

(12) United States Patent
Nozuyama

(10) Patent No.: US 8,886,487 B2
(45) Date of Patent: Nov. 11, 2014

(54) BRIDGE FAULT REMOVAL APPARATUS, BRIDGE FAULT REMOVAL METHOD, AND COMPUTER READABLE MEDIUM COMPRISING COMPUTER PROGRAM CODE FOR REMOVING BRIDGE FAULT

(75) Inventor: Yasuyuki Nozuyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 528 days.

(21) Appl. No.: 12/700,158

(22) Filed: Feb. 4, 2010

(65) Prior Publication Data

US 2010/0204947 A1    Aug. 12, 2010

(30) Foreign Application Priority Data

Feb. 6, 2009    (JP) .................................. 2009-26446

(51) Int. Cl.

| G01R 27/28 | (2006.01) |
|---|---|
| G01R 31/00 | (2006.01) |
| G01R 31/14 | (2006.01) |
| G01R 31/02 | (2006.01) |
| G01R 31/26 | (2014.01) |
| G01R 31/28 | (2006.01) |
| G01R 31/3183 | (2006.01) |

(52) U.S. Cl.
CPC .... *G01R 31/2853* (2013.01); *G01R 31/318364* (2013.01)
USPC ..................................... 702/117; 324/762.02

(58) Field of Classification Search
USPC ........................... 702/117; 6/117; 324/762.02
See application file for complete search history.

(56) References Cited

U.S. PATENT DOCUMENTS

| 7,283,918 B2 | 10/2007 | Nozuyama |
|---|---|---|
| 7,392,146 B2 | 6/2008 | Nozuyama |
| 7,406,645 B2 | 7/2008 | Nozuyama |
| 2002/0144219 A1* | 10/2002 | Zachariah et al. ................. 716/4 |
| 2006/0005094 A1* | 1/2006 | Nozuyama ..................... 714/738 |
| 2008/0262761 A1 | 10/2008 | Nozuyama |
| 2009/0210764 A1 | 8/2009 | Nozuyama |

FOREIGN PATENT DOCUMENTS

| JP | 2003-107138 | 4/2003 |
|---|---|---|
| JP | 2007-147503 | 6/2007 |
| JP | 2007-179416 | 7/2007 |
| JP | 2008-021001 | 1/2008 |

OTHER PUBLICATIONS

Nozuyama, et al. A Method for Estimating and Enhancing Test Quality Using Layout Information—A basic method and a few examples (bridge fault Iddq test, weighted stuck-at fault coverage), Technical Report of IEICE (Japan), vol. CPM2002-152, pp. 1-6, Jan. 2003.

Sengupta, et al. Defect-Based Test: A Key Enabler for Successful Migration to Structural Test, Intel Technology Journal, pp. 1-14, Q1'99.

Office Action for Japanese Patent Application No. 2009-026446 dated Jun. 1, 2012.

* cited by examiner

*Primary Examiner* — John Breene
*Assistant Examiner* — Manuel Rivera Vargas
(74) *Attorney, Agent, or Firm* — White & Case LLP

(57) ABSTRACT

A bridge fault removal apparatus includes a bridge fault extraction unit configured to extract a bridge fault from layout information of a semiconductor integrated circuit, a test pattern generator configured to generate the test pattern aiming at the bridge fault extracted by the bridge fault extraction unit, a logical value information calculator configured to calculate logical value information of all the signals in the semiconductor integrated circuit by applying the test pattern generated by the test pattern generator to logical connection information of the semiconductor integrated circuit, and a bridge fault remover configured to select an exchange signal candidate for an undetected bridge fault signal corresponding to the test pattern based on the logical value information calculated by the logical value information calculator.

15 Claims, 10 Drawing Sheets

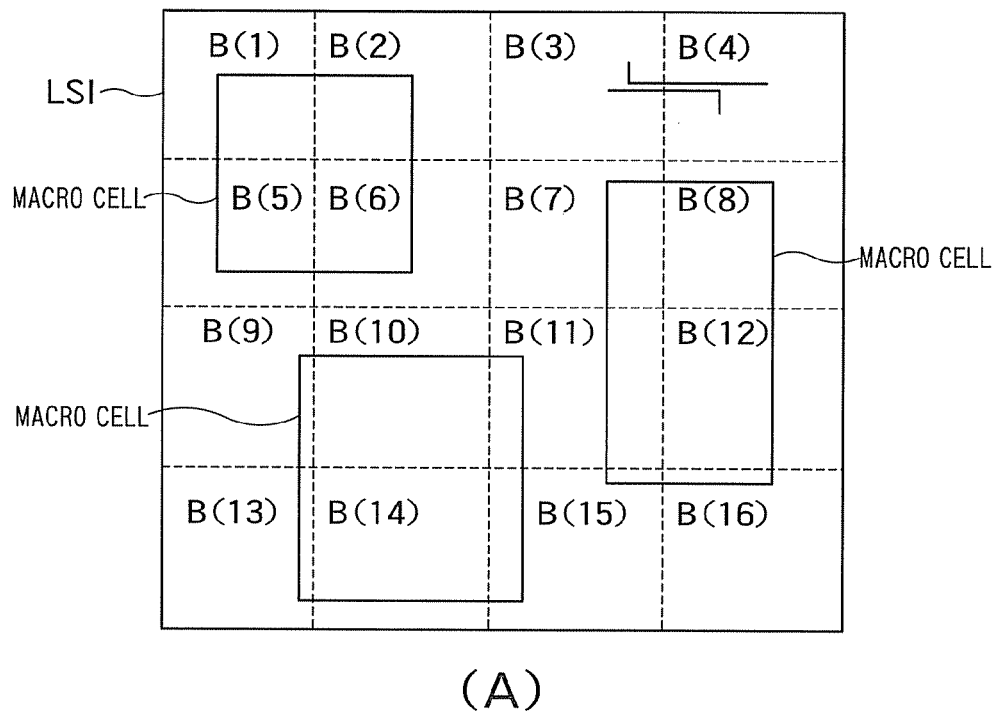
(A)
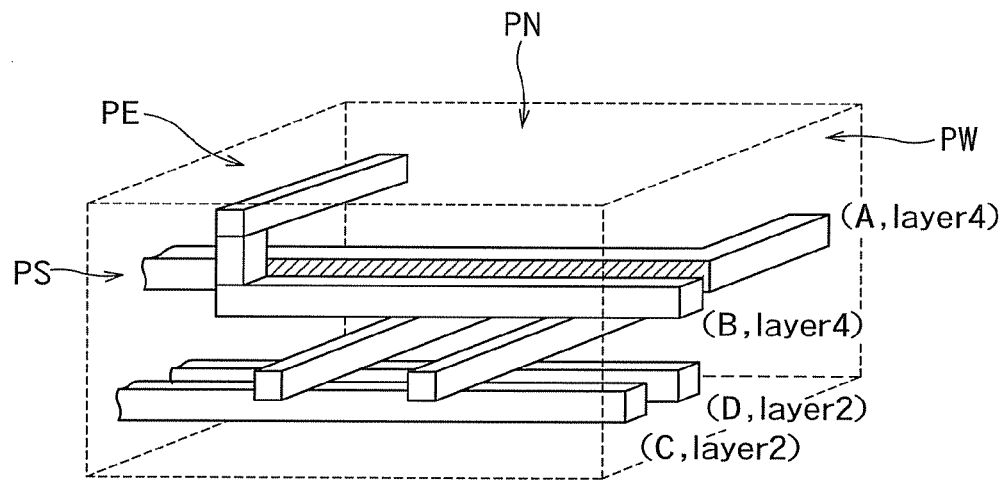
(B)
FIG. 4

```
block <BLOCK IDENTIFICATION NAME>, <COORDINATE AT LOWER RIGHT>, <COODINATE AT HIGHER LEFT>;
<SECTION IDENTIFICATION NAME>:
        <SIGNAL NAME>, <LAYER>, <SIGNAL DIRECTION TO SECTION>;
              •
  end block
```

(A)

```
    block B(135), (2400, 3600), (2800, 4000)
        PN:
          /top/sdcs/n129, 3, V;
          /top/sdcs/n398, 2, H;
                •
        PS
              •
    end block
```

| BRIDGE FAULT SIGNAL NAME IN PAIRS | DETAILED BRIDGE FAULT INFORMATION IN EACH PROXIMITY (NEIGHBORING) DISTANCE CLASSIFICATION | |
|---|---|---|
| | PROXIMITY DISTANCE CLASSIFICATION 1 | PROXIMITY DISTANCE CLASSIFICATION 2 ... |
| BRIDGE FAULT SIGNAL NAME A / BRIDGE FAULT SIGNAL NAME B | BRIDGE FAULT INFORMATION<br>DETAILED BRIDGE FAULT INFORMATION IN LAYER 1,<br>DETAILED BRIDGE FAULT INFORMATION IN LAYER 2,<br>...<br>DETAILED BRIDGE FAULT INFORMATION IN LAYER n | BRIDGE FAULT INFORMATION<br>DETAILED BRIDGE FAULT INFORMATION IN LAYER 1,<br>DETAILED BRIDGE FAULT INFORMATION IN LAYER 2,<br>...<br>DETAILED BRIDGE FAULT INFORMATION OF INTERCONNECTION IN LAYER n |

(A)

| BRIDGE FAULT SIGNAL NAME IN PAIRS | DETAILED BRIDGE FAULT INFORMATION IN EACH PROXIMITY DISTANCE CLASSIFICATION | | |
|---|---|---|---|
| | $d_1$ | $d_2$ | $d_3$ |
| /top/aw/n352<br>/top/n391 | ,353:120.56+364:2.35<br>,,421:35.43 | 0 | 0 |
| /top/ewo/n219<br>/top/eqy/n928 | 0 | ,,538/598:150.94, | 0 |

|   | PT1 | PT2 | PT3 | PT4 | PT5 | PT6 | PT7 | PT8 |   |
|---|---|---|---|---|---|---|---|---|---|
| A | 0 | 0 | 1 | 1 | 1 | 1 | 1 | 0 |   |
| B | 0 | 0 | 1 | 1 | 1 | 1 | 1 | 0 |   |
| C | 0 | 0 | 1 | 0 | 1 | 1 | 1 | 0 | → FIRST EXCHANGE CANDIDATE (EXCLUSION) |
| D | 0 | 1 | 1 | 1 | 1 | 0 | 1 | 0 | → FIRST EXCHANGE CANDIDATE (SECOND) |
| E | 0 | 0 | 1 | 1 | 0 | 1 | 1 | 1 |   |
| F | 1 | 0 | 0 | 1 | 1 | 0 | 1 | 0 | → FIRST EXCHANGE CANDIDATE (EXCLUSION) |
| G | 0 | 0 | 1 | 1 | 1 | 1 | 1 | 0 | → FIRST EXCHANGE CANDIDATE (EXCLUSION) |

FIG. 8

BRIDGE FAULT REMOVAL APPARATUS, BRIDGE FAULT REMOVAL METHOD, AND COMPUTER READABLE MEDIUM COMPRISING COMPUTER PROGRAM CODE FOR REMOVING BRIDGE FAULT

CROSS-REFERENCE TO RELATED APPLICATION

This application is based upon and claims the benefit of priority from the prior Japanese Patent Application No. 2009-026446, filed on Feb. 6, 2009; the entire contents of which are incorporated herein by reference.

BACKGROUND OF THE INVENTION

1. Field of the Invention

The present invention relates to a bridge fault removal apparatus, a bridge fault removal method, and a computer readable medium comprising computer program code for removing bridge fault. Particularly the invention relates to the bridge fault removal apparatus, the bridge fault removal method, and the computer readable medium comprising computer program code for removing a bridge failure in a semiconductor integrated circuit such as LSI (Large Scale Integration) manufactured by a microfabrication process.

2. Related Art

In the recent semiconductor integrated circuit such as LSI, dust tends to adhere between interconnections to establish conduction with the finer microfabrication process and the multi-layered interconnection (including resistivity). When the interconnections become different potentials, a bridge failure incidence ratio in which a faulty signal propagates to the outside of LSI to cause a malfunction is rapidly increased. For example, the microfabrication process reaches 32 nm, and lengths of proximity interconnection wires exceed 100 m even in LSI having an average size. Therefore, the bridge failure incidence ratio is extremely enhanced.

Conventionally, in a test (hereinafter referred to as "bridge fault test") for such bridge failure in LSI, a pair of proximity interconnection wires is extracted from layout information on an object LSI as a bridge fault having a high possibility of causing the bridge failure. Then, a test pattern is generated so as to detect the bridge fault, and is applied to LSI so as to effectively detect the bridge failure. Particularly, practical use of a bridge fault IDDQ test that can be comparatively easily realized has been mainly developed. In the bridge fault IDDQ test, a static source current (IDDQ (IDD Quiescent)) is measured in each bridge fault test pattern, and an abnormal IDDQ that is passed when the bridge fault in which the pair of interconnections becomes (1,0) or (0,1) includes the bridge failure is measured to detect the bridge failure.

However, in LSI used in a high-speed product manufactured through the microfabrication process, because ordinary IDDQ value is largely increased, the IDDQ test is hard.

Bridge fault test using a logical level detection is also well known in addition to the IDDQ test. Examples of the bridge fault test using the logical level detection include a test in which a bridge fault type such as "Wired-AND" and "Wired-OR" is dealt with in order to simply test LSI and a test in which an object bridge fault is the bridge failure correctly modeled by a complicated combination of the layout information and circuit information.

Four kinds of bridge faults, that is, "Wired-AND", "Wired-OR", "A-Dominate", and "B-Dominate", are detected in the ordinal bridge fault test using the logical level detection. The kind of the bridge fault is determined by elements that drive the two signal lines constituting the bridge, inputs to the elements, a resistance value between short-circuited signals, a cell that receives each signal, and a logical threshold of a corresponding input terminal. Therefore, in the bridge fault test, it is necessary to properly extract these pieces of information. In the bridge fault test, when accuracy of the test result exceeds a predetermined level, an effect that is obtained by improving the accuracy of the test result tends to be weakened. Therefore, it is necessary to realize the bridge fault test in which the practical accuracy is easy to achieve.

However, it is extremely difficult to completely extract the pieces of information. Particularly, in the bridge fault test for LSI, a large amount of CPU (Central Processing Unit) resource is necessary. Therefore, the bridge fault test achieving the practical accuracy is hardly realized.

On the other hand, an ATPG (Automatic Test Pattern Generation) tool is well known as a tool that easily realizes the IDDQ test and the bridge fault test (for example, see JP-A No. 2007-147503 (Kokai)).

However, in the ATPG tool, because the test pattern is generated according to a generation algorithm based on a scan test technique that is basic and is designed to make a test easy, the number of finally-detectable bridge faults is determined by the number of test patterns for an LSI logical net including an easily-testable design circuit such as a scan. As a result, an undetected bridge fault always remains, and the bridge failure cannot be detected even if the bridge failure occurs in the pair of interconnections corresponding to the bridge fault. Therefore, the bridge failure incidence ratio cannot sufficiently be reduced. Additionally, in the ATPG tool, because some of the bridge faults remain undetected when only a few test patterns are used, a test quality is hardly improved. As a result, since it is difficult to shorten an IDDQ measuring time compared with other test techniques (currently, at least one millisecond to several milliseconds are necessary for one pattern), a large effect cannot be obtained even if the ATPG tool is used in the IDDQ test in which the improvement of test quality is obtained by few test patterns.

Particularly, the undetected bridge fault that is not determined by the ATPG tool as untestable can be logically activated. As a result, in the case where the bridge failure corresponding to the bridge fault occurs in a product LSI, the product LSI that is shipped as non-defective can be activated to become a defective product when the product LSI operated on a user's system. Additionally, even if the product LSI is returned and is tested again, the returned product LSI passes the test. Therefore, the cause of the bridge failure can be left unclear.

On the other hand, in order to reduce the crosstalk failure, a technique of widening a distance between proximity interconnections to locally lower the bridge failure incidence ratio is well known (for example, see JP-A No. 2008-21001 (Kokai) and JP-A No. 2007-179416 (Kokai)).

Although the conventional technique widens the distance between the proximity interconnection wires that are disposed in parallel at a large length with respect to given LSI layout information, resulting in increase of an area of LSI. Therefore, it is difficult to lower the bridge failure incidence effectively by widen the distance between the proximity interconnection wires. Therefore, the bridge failure incidence ratio in LSI cannot sufficiently be reduced by the conventional technique.

BRIEF SUMMARY OF THE INVENTION

According to a first aspect of the present invention, there is provided a bridge fault removal apparatus comprising:

a bridge fault extraction unit configured to extract a bridge fault from layout information of a semiconductor integrated circuit;

a test pattern generator configured to generate the test pattern aiming at the bridge fault extracted by the bridge fault extraction unit;

a logical value information calculator configured to calculate logical value information of all the signals in the semiconductor integrated circuit by applying the test pattern generated by the test pattern generator to logical connection information of the semiconductor integrated circuit; and a bridge fault remover configured to select an exchange signal candidate for an undetected bridge fault signal corresponding to the test pattern based on the logical value information calculated by the logical value information calculator.

According to a second aspect of the present invention, there is provided a bridge fault removal method comprising:

extracting a bridge fault from layout information of a semiconductor integrated circuit;

generating the test pattern aiming at the extracted bridge fault;

calculating logical value information of all the signals in the semiconductor integrated circuit by applying the generated test pattern to logical connection information of the semiconductor integrated circuit; and selecting an exchange signal candidate for an undetected bridge fault signal corresponding to the test pattern based on the calculated logical value information.

According to a third aspect of the present invention, there is provided a medium storing a bridge fault removal program configured to make a computer to execute a bridge fault removal method comprising:

extracting a bridge fault from layout information of a semiconductor integrated circuit;

generating the test pattern aiming at the extracted bridge fault;

calculating logical value information of all the signals in the semiconductor integrated circuit by applying the generated test pattern to logical connection information of the semiconductor integrated circuit; and selecting an exchange signal candidate for an undetected bridge fault signal corresponding to the test pattern based on the calculated logical value information.

BRIEF DESCRIPTION OF THE DRAWINGS

FIG. 4 is a schematic diagram illustrating a layout divide step (S302) illustrated in FIG. 3.

FIG. 5 is a schematic diagram illustrating a data structure of block layout information 16d illustrated in FIG. 2.

FIG. 7 is a schematic diagram illustrating a data structure of a bridge fault list 16e illustrated in FIG. 2.

FIG. 8 is a schematic diagram illustrating a data structure of logical value information 16j illustrated in FIG. 2.

DETAILED DESCRIPTION OF THE INVENTION

Hereafter, an embodiment of the present invention will be described more specifically with reference to the drawings. The embodiment is described only by way of example, and the scope of the present invention is not limited to the embodiment.

Figure 1:
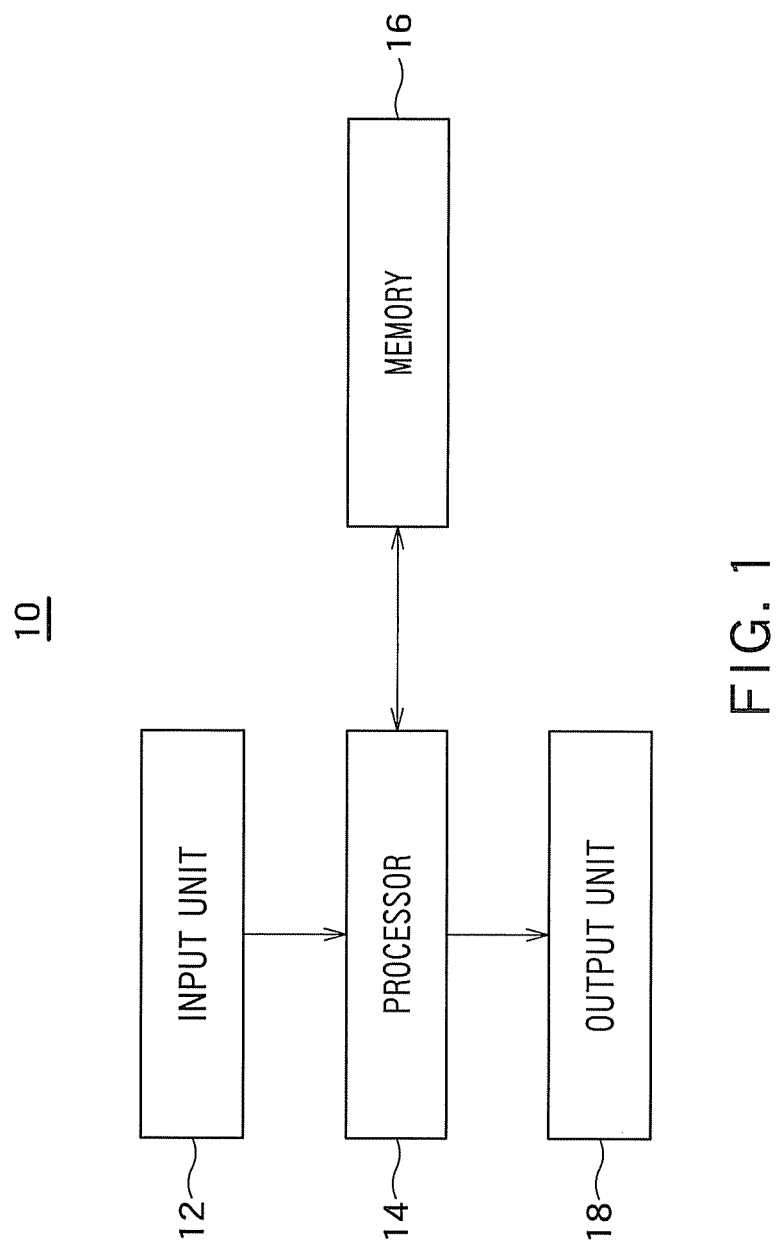
FIG. 1 is a block diagram illustrating the configuration of the bridge fault removal apparatus 10 according to the embodiment of the present invention.
Figure 2:
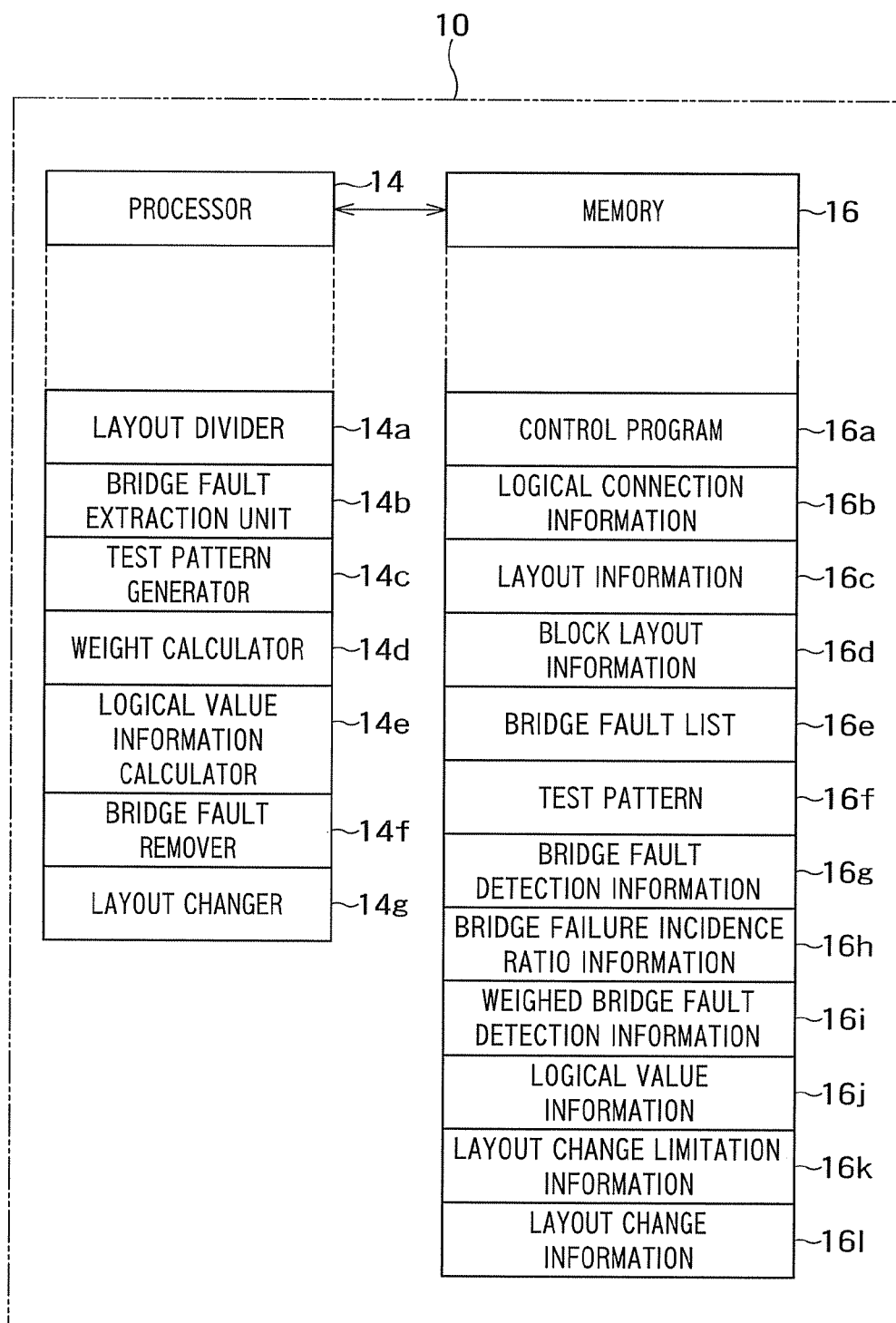
FIG. 2 is a block diagram illustrating the detailed configuration of the bridge fault removal apparatus 10 illustrated in FIG. 1.

A configuration of a bridge fault removal apparatus 10 according to an embodiment of the present invention will be described with reference to FIGS. 1 and 2. FIG. 1 is a block diagram illustrating the configuration of the bridge fault removal apparatus 10 according to the embodiment of the present invention. FIG. 2 is a block diagram illustrating the detailed configuration of the bridge fault removal apparatus 10 illustrated in FIG. 1.

Referring to FIG. 1, the bridge fault removal apparatus 10 includes an input unit 12, a processor 14, a memory 16, and an output unit 18.

The input unit 12 is connected to the processor 14. The input unit 12 transmits information fed by a user to the processor 14. For example, examples of the input unit 12 is arbitrarily include a keyboard, a mouse, recognition devices such an Optical Character Reader (OCR), image input devices such as a scanner, an external medium drive such as a flexible disk, CD-R (Compact Disc-Recordable), DVD (Digital Versatile Disc), and an USB (Universal Serial Bus) memory, storage devices such as a hard disk standalone or connected to a network, and special input devices such as a sound recognition device.

The processor 14 is connected to the input unit 12, the memory 16, and the output unit 18. As illustrated in FIG. 2, the processor 14 activates a control program 16a stored in the memory 16 according to information transmitted from the input unit 12 to realize a layout divider 14a, a bridge fault extraction unit 14b, a test pattern generator 14c, a weight calculator 14d, a logical value information calculator 14e, a bridge fault remover 14f, and a layout changer 14g. The processor 14 reads out predetermined data from the memory 16 or writes predetermined data into the memory 16. The processor 14 transmits predetermined information to the output unit 18. For example, the processor 14 is a control device such as CPU.

The memory 16 is connected to the processor 14. As illustrated in FIG. 2, in addition to the control program 16a for the processor 14, logical connection information (logical net) 16b of LSI, layout information 16c, block layout information 16d, a bridge fault list 16e, a test pattern 16f, a bridge fault detection information 16g, bridge failure incidence ratio information 16h, weighed bridge fault detection information 16i, logical value information 16j, layout change limitation information 16k, layout change information 16l, and various kinds of data are stored in the memory 16. The memory 16 also acts as a working memory for the processor 14. Examples of the memory 16 include a computer-readable medium such as external media such as RAM (Random Access Memory), a flexible disk, CD-R, DVD, and an USB memory and storage devices such as a hard disk standalone or connected to a network. The logical connection information (logical net) 16b of LSI is composed of components that are appropriately selected from a cell library including a basic cell, a macro cell such as RAM and ROM (Read Only Memory), and an input/output terminal cell, in order to realize a predetermined logical behavior and operational speed, and interconnection signal wires connected to the components. The cells of cell library corresponding to the logical connection information 16b include pieces of terminal information (such as a terminal name, an input/output property, and a terminal capacity) of each cell and information (including behavior during the test) on the logical behavior. The cells of cell library corresponding to the logical connection information 16b may include information on a delay from an input terminal to an output terminal. As with the logical connection information 16b, the layout information 16c of LSI includes components such as the basic cell, the macro cell, and the input/output terminal cell that are selected from the cell library corresponding to those of the cell library of the logical connection information 16b, and the interconnection signal wires connected to the components. The cell library corresponding to the layout information 16c includes shapes (coordinates) of the basic cell, macro cell, and input/output terminal cell, and pieces of terminal information (such as the terminal name, the position (coordinate), the input/output property, and the terminal capacity) of each cell. At this point, the logical connection information 16b and the layout information 16c also include cell information selected from the cell library.

The output unit 18 is connected to the processor 14. The output unit 18 outputs the information transmitted from the processor 14. For example, examples of the output unit 18 include a display device such as LCD (Liquid Crystal Display) and a CRT (Cathode Ray Tube) display, a printing device (an inkjet printer and a laser printer), an external write-in storage device such as a flexible disk, CD-R, DVD, and an USB memory, and a storage device such as a hard disk standalone or connected to a network.

Figure 3:
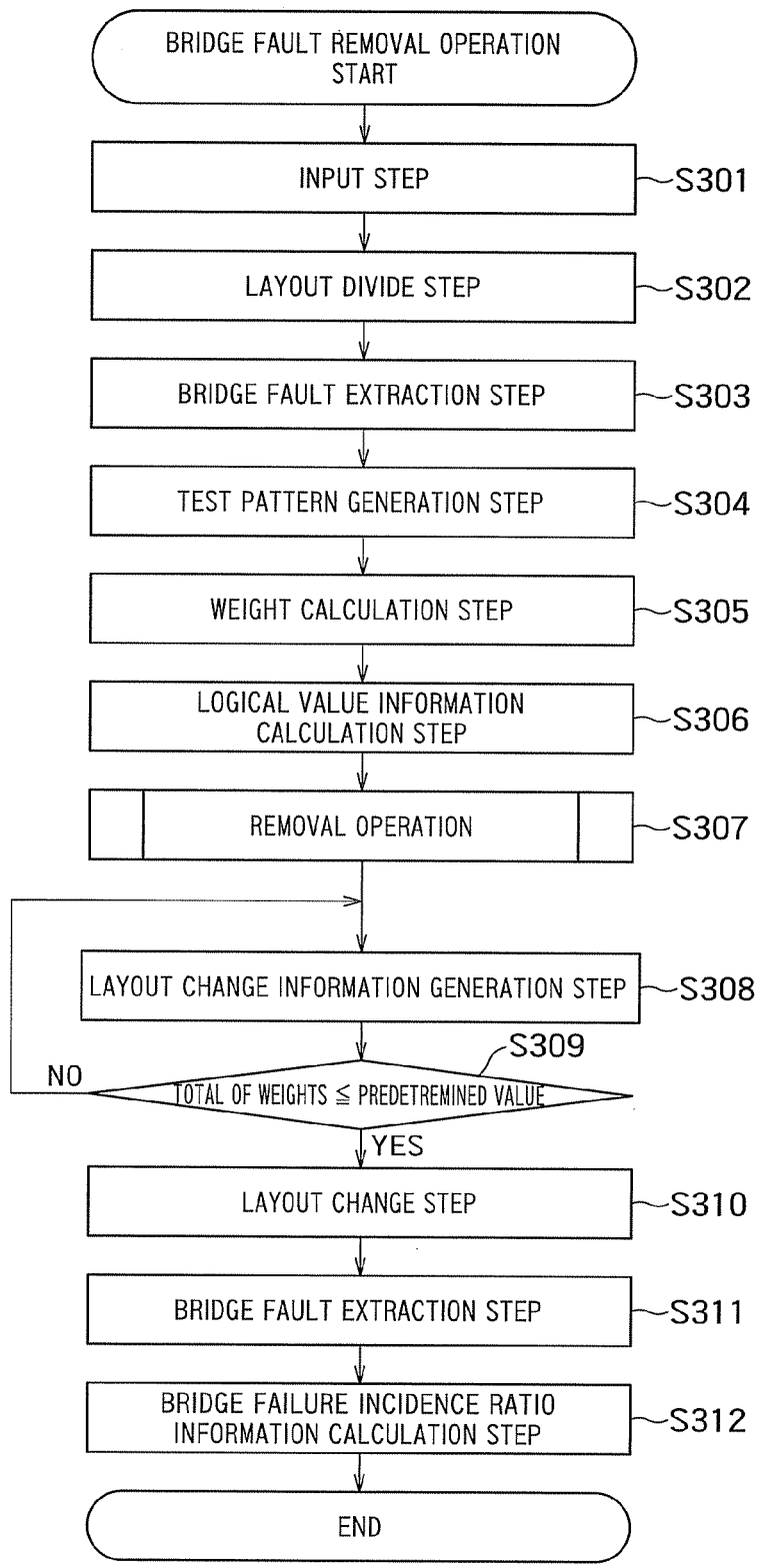
FIG. 3 is a flowchart illustrating a procedure of a bridge fault removal operation according to the embodiment of the present invention.
Figure 6:
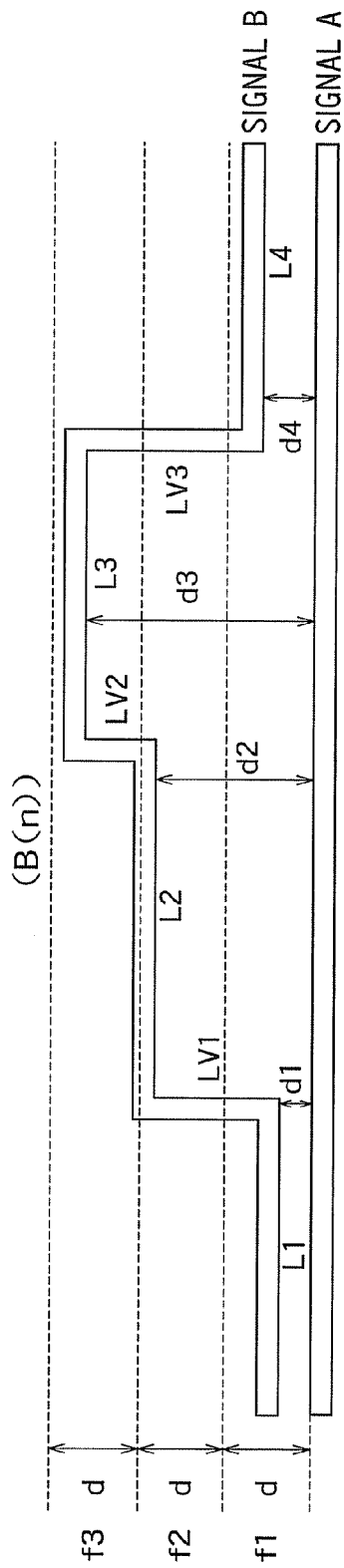
FIG. 6 is a schematic diagram illustrating individual layout information.
Figure 9:
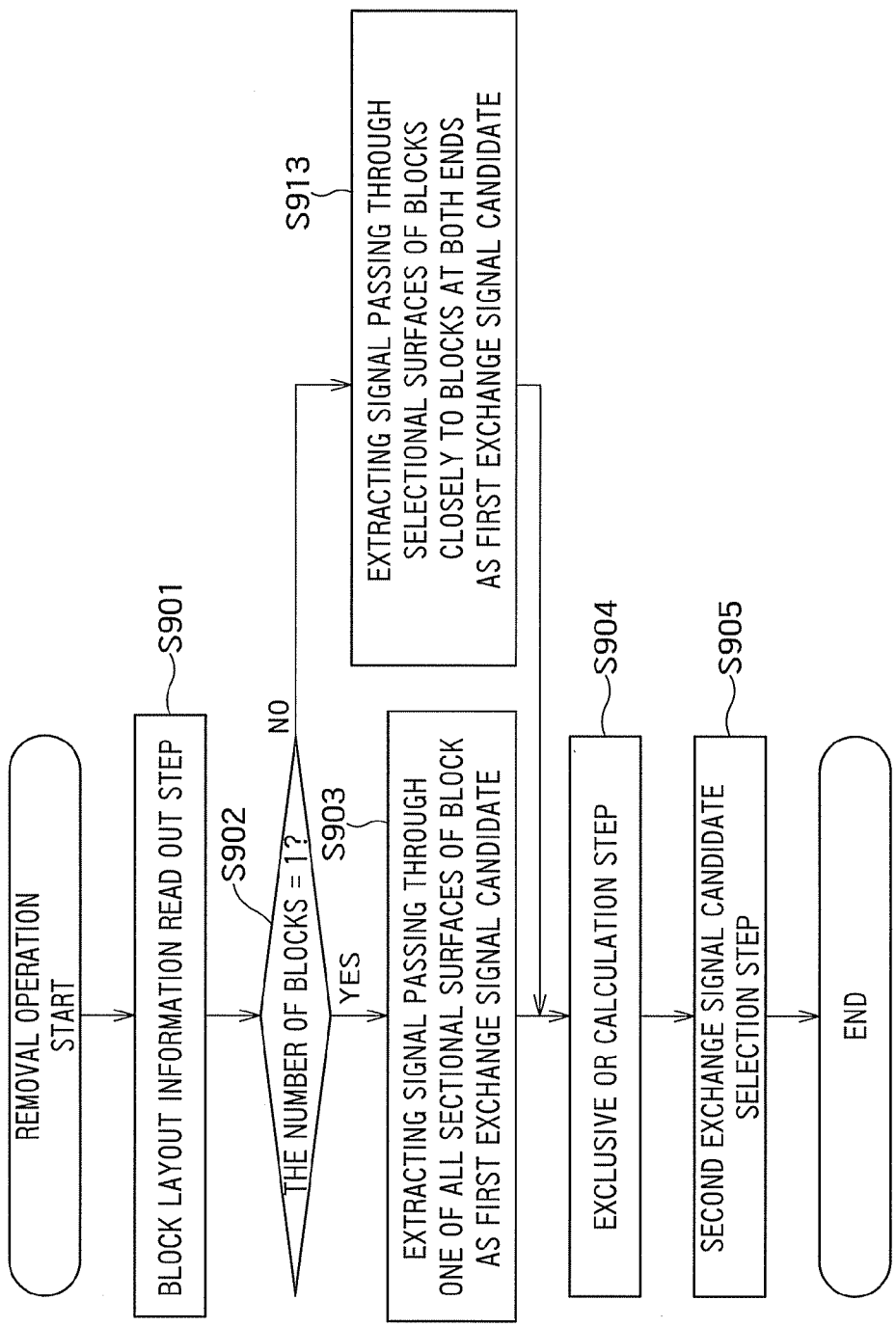
FIG. 9 is a flowchart illustrating a procedure of a removal operation (S307) illustrated in FIG. 3.
Figure 10:
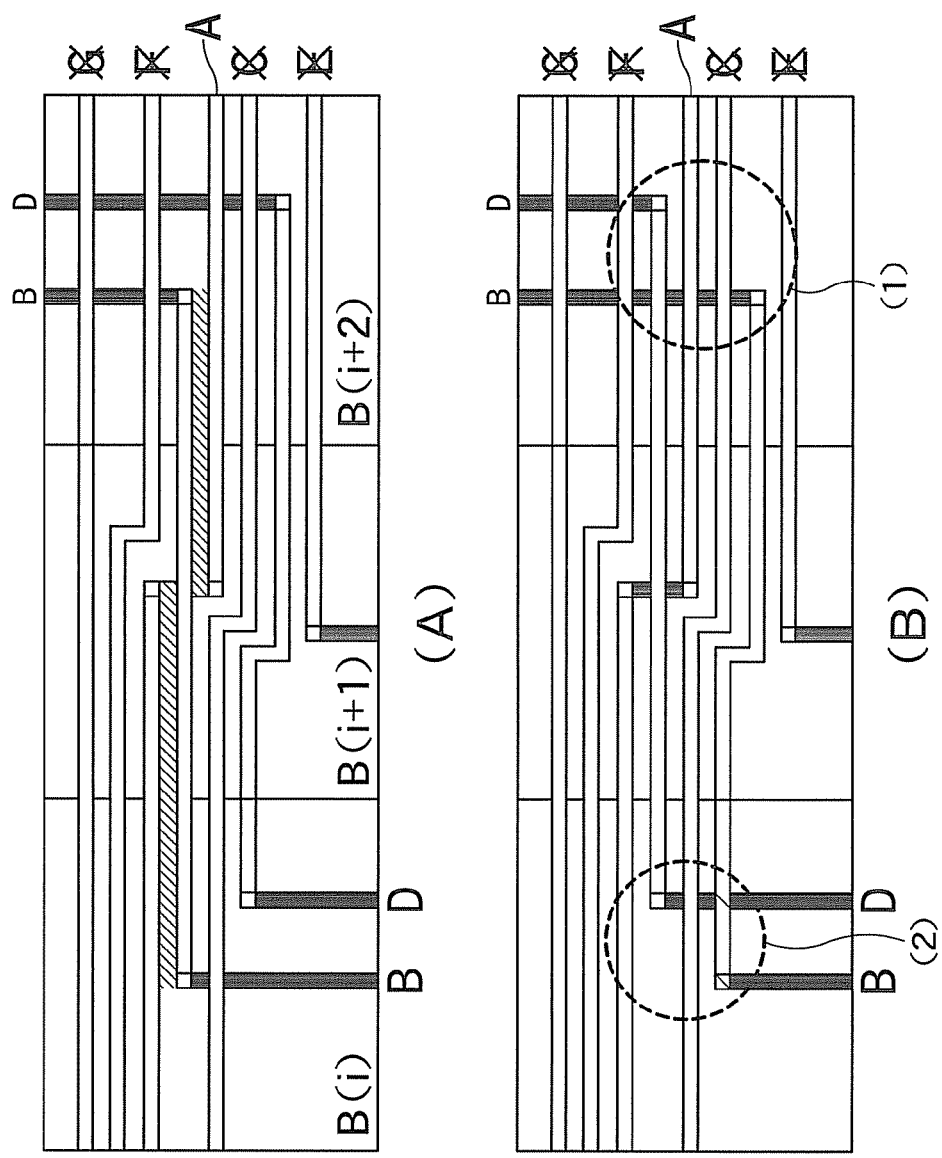
FIG. 10 is a schematic diagram illustrating a layout change information generation step (S308) illustrated in FIG. 3.

An operation of the bridge fault removal apparatus 10 illustrated in FIG. 1 will be described with reference to FIGS. 3 to 10. The following operation is executed when the processor 14 activates the control program 16a stored in the memory 16. FIG. 3 is a flowchart illustrating a procedure of a bridge fault removal operation according to the embodiment of the present invention. FIG. 4 is a schematic diagram illustrating a layout divide step (S302) illustrated in FIG. 3. FIG. 5 is a schematic diagram illustrating a data structure of block layout information 16d illustrated in FIG. 2. FIG. 6 is a schematic diagram illustrating individual layout information. FIG. 7 is a schematic diagram illustrating a data structure of a bridge fault list 16e illustrated in FIG. 2. FIG. 8 is a schematic diagram illustrating a data structure of logical value information 16j illustrated in FIG. 2. FIG. 9 is a flowchart illustrating a procedure of a removal operation (S307) illustrated in FIG. 3. FIG. 10 is a schematic diagram illustrating a layout change information generation step (S308) illustrated in FIG. 3.

<FIG. 3: INPUT STEP (S301)> In the input step (S301), the input unit 12 receives the logical connection information 16b and layout information 16c, which are fed by the user, for LSI to be tested, and transmits the received logical connection information 16b and layout information 16c to the processor 14. Then the processor 14 writes the logical connection information 16b and layout information 16c, which are transmitted from the input unit 12, into the memory 16. The following pieces of layout information 16c can be used as the layout information 16c: (1) The layout information in which the basic cell, the macro cell, and the input/output terminal cell are placed and schematic interconnection wires between these cells are routed, (2) The layout information in which CTS (Clock Tree Synthesis) is applied to the layout information of (1), and (3) The layout information in which ECO (Electrical Change of Order) is applied to the layout information of (2). Ordinarily, although accuracy of the bridge fault (signal pair and a length of proximity part of the signal wires) is enhanced from the layout information (1) toward the layout information (3), a degree of freedom of a layout change is lowered. Therefore, in the embodiment of the present invention, the most effective layout information is desirably selected.

<FIG. 3: LAYOUT DIVIDE STEP (S302)> In the layout divide step (S302), the layout divider 14a divides the layout information 16c into plural blocks, generates the block layout information 16d including interconnection information on a section of each block, and writes the block layout information 16d into the memory 16. For example, the layout divider 14a divides the layout into the plural blocks having arbitrary sizes based on the layout information 16c stored in the memory 16 in the input step (S301) and generates the block layout information 16d including the interconnection information on each block by adding an identification number (for example, B(1), B(2), B(n)) to each block (see FIG. 4(A)). In FIG. 4(A), three rectangular shapes in LSI are macro cells such as RAM. As illustrated in FIG. 4(B), examples of the block layout information 16d include a coordinate of each block, layout information on an inter-cell interconnection portion, information (signal name and interconnection layer name) on an interconnection passing through a sectional portion (for example, four surfaces of PN, PS, PE, and PW), and information (signal name and interconnection layer name) on an interconnection that runs in parallel with and closely to the sectional portion.

The block layout information 16d has a data structure illustrated in FIG. 5(A). FIG. 5(B) illustrates an example of the data structure of the block layout information 16d. In FIG. 5(B), the letter "V" designates a direction perpendicular (vertical) to the sectional surface, and the letter "H" designates a horizontal direction to the sectional surface.

<FIG. 3: BRIDGE FAULT EXTRACTION STEP (303)> In the bridge fault extraction step (S303), the bridge fault extraction unit 14b extracts the bridge fault and the individual layout information (such as a proximity (neighboring) distance, an element length of proximity (neighboring) part of interconnection signal wires, an interconnection layer, an identification number of a block including the bridge fault, and a bridge failure incidence ratio) in each proximity distance classification based on the interconnection information in the block layout information 16d generated in the layout divide step (S302), generates the bridge fault list 16e, and writes the bridge fault list 16e into the memory 16. As illustrated in FIG. 6, for example, the individual layout information includes a proximity (neighboring) distance (d1 to d4) between a signal A and a signal B or a proximity distance classification (such as proximity to a distance d, proximity from the distance d to the distance 2×d, and proximity from the distance 2×d to the distance 3×d), an element length of proximity part of (interconnection) signal wires A and B (L1 to L4 (and LV1 to LV3)), an interconnection layer, an identification number (B(n)) of a block including a bridge fault, and a bridge failure incidence ratio (f1 to f3). The bridge failure incidence ratio is estimated from a failure incidence status of other product in a process for manufacturing LSI and a result of TEG (Test Element Group) that is generated in order to investigate and analyze a basic failure (or defect) mode in the process or a failure (defect) incidence ratio of the process.

In the bridge fault removal operation according to the embodiment of the present invention, the layout divide step (S302) may be omitted or be executed in concurrence with the bridge fault extraction step (S303).

<FIG. 3: TEST PATTERN GENERATION STEP (S304)> In the test pattern generation step (S304), the test pattern generator 14c generates the test pattern 16f for the bridge fault (for example, bridge fault list 16e) extracted in the bridge fault extraction step (S303), and writes the generated test pattern 16f into the memory 16. For example, the test pattern 16f includes logical value information that can be set outside and to be set in flip-flops inside LSI that can be controlled from outside of LSI for an IDDQ measuring point. At this point, the test pattern generator 14c generates the bridge fault detection information 16g indicating a bridge fault detection status (such as "DETECTED", "UNDETECTED", and "POTENTIALLY DETECTED") using the ATPG tool to the object bridge fault, and writes the bridge fault detection information 16g into the memory 16.

<FIG. 3: WEIGHT CALCULATION STEP (S305)> In the weight calculation step (S305), the weight calculator 14d adds a weight to the bridge fault extracted in the bridge fault extraction step (S303) based on the bridge fault detection information 16g, and the element length of proximity (neighboring) part of interconnection signal wires and bridge failure incidence ratio in each proximity distance classification in the bridge fault list 16e. The weight calculator 14d calculates a weighed bridge fault detection ratio. The weight calculator 14d rearranges the undetected bridge faults in the order of weight based on the weight information such as the element length of proximity (neighboring) part of interconnection signal wires, generates the weighed bridge fault detection information 16i, and transmits the weighed bridge fault detection information 16i to the output unit 18 while writing the weighed bridge fault detection information 16i into the memory 16. Then the output unit 18 outputs the weighed bridge fault detection information 16j transmitted from the weight calculator 14d. For example, as illustrated in FIG. 7(A), the bridge fault list 16e has a data structure that includes "DETAILED BRIDGE FAULT INFORMATION IN EACH PROXIMITY (NEIGHBORING) DISTANCE CLASSIFICATION" in each "BRIDGE FAULT SIGNAL NAME IN PAIRS". The "BRIDGE FAULT SIGNAL NAME IN PAIRS" is a combination of signal names constituting the bridge fault. The detailed bridge fault information corresponding to a certain proximity distance classification includes the detailed bridge fault information in each interconnection layer as follows: "<DETAILED BRIDGE FAULT INFORMATION OF INTERCONNECTION IN LAYER 1>, <DETAILED BRIDGE FAULT INFORMATION OF INTERCONNECTION IN LAYER 2>, ..., <DETAILED BRIDGE FAULT INFORMATION OF INTERCONNECTION IN LAYER n>". Comma "," is used as a delimiter of each interconnection layer data.

The "DETAILED BRIDGE FAULT INFORMATION IN EACH INTERCONNECTION LAYER" is expressed by a function of "Σ<BLOCK IDENTIFICATION NUMBER>: <LENGTH OF PROXIMITY PART OF INTERCONNECTION SIGNAL WIRES>". Because the fault list has the data structure illustrated in FIG. 7(A), the same signal pairs can be distinguished from each other even if the same signal pairs are closed to each other in different blocks. The pieces of bridge fault information in the same layer in the same block are collectively expressed. When the bridge fault signal also exists in the adjacent block, for example, the bridge fault signal is expressed by "<BLOCK IDENTIFICATION NUMBER 1>/<BLOCK IDENTIFICATION NUMBER 2>". When the bridge fault does not exist in any layers, the bridge fault information is expressed by "NULL DATA". When the data does not exist at all, the bridge fault information is expressed by "0". FIG. 7(B) illustrates an example of the bridge fault list 16e on the display. In FIG. 7(B), exemplarily, the proximity distance classification is displayed by d1 to d3, and the four layers are displayed, each distinguished by ",". The signals corresponding to "BRIDGE FAULT SIGNAL NAME IN PAIRS" illustrated in FIG. 7(A) may include hierarchical connection information on the signals in LSI. Alternatively, in order to avoid complication, a bridge fault file including a serial number of each "BRIDGE FAULT SIGNAL NAME IN PAIRS" is stored in the memory 16, and only the serial number may be displayed in the "BRIDGE FAULT SIGNAL NAME IN PAIRS" in the bridge fault list 16e.

<FIG. 3: LOGICAL VALUE INFORMATION CALCULATION STEP (S306)> In the logical value information calculation step (S306), in order to remove the undetected bridge faults rearranged in the order of weight in the weight calculation step (S305), the logical value information calculator 14e applies the test pattern 16f generated in the test pattern generation step (S304) to the logical connection information 16b, calculates the pieces of logical value information 16j of all the signals in LSI, and writes the pieces of logical value information 16j into the memory 16. For example, the logical value information calculator 14e calculates the logical value information 16j that includes logical values of all the signals in LSI for each test pattern generated in the test pattern generation step (S304) using a logical simulator attached to the ATPG tool. For example, as illustrated in FIG. 8, the logical value information 16j has a data structure including a logical value (1/0) in each signal in each test pattern (PT). Logical value may also be X (unknown) or Z (high-impedance).

<FIG. 3: REMOVAL OPERATION (S307)> In the removal operation (S307), the bridge fault remover 14f selects an exchange signal candidate for the undetected bridge fault signal in the test pattern 16f based on the logical value information 16j calculated in the logical value information calculation step (S306). The removal operation (S307) will be described below with reference to FIG. 9.

<FIG. 9: BLOCK LAYOUT INFORMATION READ OUT STEP (S901)> In the block layout information read out step (S901), the bridge fault remover 14f reads out the block layout information 16d including the undetected bridge fault that is of the object from the memory 16.

<FIG. 9: S902, S903, and S913> In step S902, the bridge fault remover 14f determines whether one or the plural blocks are read out in the block layout information read out step (S901). When the one block is read out (YES in S902), the bridge fault remover 14f extracts signals passing through one of all the sectional surfaces of the block as the first exchange signal candidates (S903). When the plural blocks are read out (NO in S902), the bridge fault remover 14f extracts signals passing through the sectional surfaces of the blocks closely to the blocks at both ends as the first exchange signal candidates (S913). The bridge fault remover 14f adds a priority to each first exchange signal candidate in consideration of the layout change limitation information 16k (strength of the limitation allowable for the layout of each signal in the object LSI and easiness of a change depending on the interconnection layer) stored in the memory 16. Examples of the limitation include an increase of the lengths of the interconnection wires, an amount of change of the most proximal portion length, an increase in area, an increase in delay, and deterioration of a crosstalk. For example, the change of the same layer is the easiest. The easiness of the change is determined in the order of the same layer, the layers that are separated from each other by two layers, and then the layers that are separated from each other by one layer.

<FIG. 9: EXCLUSIVE OR CALCULATION STEP (S904)> In the exclusive OR calculation step (S904), the bridge fault remover 14f calculates exclusive OR of the signal in LSI and the undetected bridge fault signal, and selects the exchange signal candidate based on the calculation result. For example, the bridge fault remover 14f reads out the logical value information 16j from the memory 16, and calculates exclusive OR of the object bridge fault signal and the first exchange signal candidate extracted in the step S903 or S913.

The exclusive OR calculation step (S904) illustrated in FIG. 9 will be described with reference to FIGS. 8 and 10. In FIG. 8, signals A and B are object bridge fault signals on an assumption that the test patterns 16f are eight patterns. In FIG. 8, because the signals A and B have the same logical-value for all the test patterns (that is, an effective (a detecting) test pattern does not exist), the signals A and B are not detected as the bridge fault. On the other hand, because signals C, D, and F have the logical values that are different from the signal A or B (that is, an effective test pattern exists), the signal pair between the signal C, D, or F and the signal A or B is detected as the bridge fault. In relation to the signals A and B, because the signal G selected as a first exchange signal candidate has the same logical value for all the test patterns as the signals A and B, the signal pair between the signal G and the signal A or B is not detected as the bridge fault. Although a signal E is detected as the bridge fault between the signal E and the signal A or B like the signals C, D and F, the signal E does not pass through the sectional surfaces that come contact with the blocks at both ends as illustrated in FIG. 10. Therefore, the signal E is not extracted as the first exchange signal candidate.

<FIG. 9: SECOND EXCHANGE SIGNAL CANDIDATE SELECTION STEP (S905)> In the second exchange signal candidate selection step (S905), the bridge fault remover 14f selects a second exchange signal candidate satisfying a predetermined condition from the first exchange signal candidates extracted in the step S903 or S913. For example, in FIG. 10, because the signals C and F have the proximity (neighboring) portions to both of the object bridge fault signal (the signal A or B), the signals C and F are excluded from the second exchange signal candidate except that the proximity portion between the signals A and B is shorter than a predetermined value. The signal G in which exclusive OR of the signals A and B becomes "0" is excluded from the second exchange signal candidate. Further the proximity (neighboring) signal of the signal G (that is, signal F in FIG. 10) is excluded except that proximity portion to its signal is shorter than the predetermined value. As a result, only the signal D is selected as the second exchange signal candidate.

In other words, in the exclusive OR calculation step (S904) and second exchange signal candidate selection step (S905) illustrated in FIG. 9, the bridge fault remover 14f calculates the exclusive OR of the undetected bridge fault signal and the first exchange signal candidate for all the test patterns. Then, the bridge fault remover 14f selects the signals from the first exchange signal candidates as the second exchange signal candidate. In the first exchange signal candidates, the exclusive OR with the undetected bridge fault signal become "1" (detected signal), the "SIGNAL NEIGHBORING TO BOTH OF THE OBJECT BRIDGE FAULT SIGNALS" is removed (except that the proximity portion with either of object bridge fault signals is shorter than a predetermined value), and in which the "SIGNAL NEIGHBORING TO THE SIGNAL WITH WHICH THE EXCLUSIVE OR OF THE OBJECT BRIDGE FAULT SIGNAL BECOMES "0" (UNDETECTED SIGNAL)" is removed (except that the proximity portion with the above signal is shorter than a predetermined value). In other word, the bridge fault remover 14f selects signals satisfying design limitations including a timing limitation of signals including the exclusive OR of "1" as the exchange signal candidate for one signal of each undetected bridge fault signal pair in the order of weight of the bridge fault weighed by the weight calculator.

In the embodiment of the present invention, preferably the bridge fault remover 14f reads out the logical value information 16b on one signal of each of all the bridge fault signal pairs that occur after the object bridge fault signal is exchanged with the second exchange signal candidate from the memory 16, calculates the exclusive OR, and selects the signal as the second exchange signal candidate when the calculation result becomes "1". In other words, the object bridge fault signal (for example, signal B) is exchanged with the second exchange signal candidate (for example, signal pair (D,E)→signal pair (B,E)) for the bridge fault in the block (including the object bridge fault) concerning the extracted second exchange signal candidate (for example, signal D).

As illustrated in FIG. 9, the removal operation (S307) illustrated in FIG. 3 ends after the second exchange signal candidate selection step (S905).

<FIG. 3: LAYOUT CHANGE INFORMATION GENERATION STEP (S308)> In the layout change information generation step (S308), the bridge fault remover 14f generates the layout change information 16l on the undetected bridge fault to write the layout change information 16l into the memory 16.

A specific example of the layout change information generation step (S308) will be described with reference to FIG. 10. FIG. 10(A) illustrates an LSI layout before the layout change information generation step (S308). FIG. 10(B) illustrates the LSI layout after the layout change information generation step (S308).

In FIG. 10(A), the signals A and B are undetected. First, detailed information on blocks (B(i), B(i+1), and B(i+2)) over a region of the bridge fault including the signals A and B is read out from the block layout information 16d. In FIG. 10(A), as a result of the second exchange signal candidate selection step (S905) illustrated in FIG. 9, the signal D becomes the second exchange signal candidate. On the other hand, in FIG. 10(B), the undetected bridge fault is removed by exchanging the signal B and the signal D. Therefore, the bridge fault remover 14f generates the layout illustrated in FIG. 10(B) as the layout change information 16l. As illustrated in FIG. 10(B), it is necessary to replace the installation of the interconnection in the regions of two points (broken lines (1) and (2)). However, because the position is not changed at a boundary between blocks of each signal, the replacement has an extremely small influence on the layout of the whole of LSI. Further the block layout information 16d over the object bridge fault is extracted. Therefore, as an undetected region (proximity portion of neighboring signal wires) is increased, overhead is relatively decreased when the layout is changed.

In the embodiment of the present invention, although the signal A can also be exchanged with and the signal D, preferably a determination is made for the case in which a load on the layout (chip area) or timing (signal delay) becomes the minimum or within a permissible range. The determination is made using an ordinary layout tool. Alternatively, in order to easily realize the layout change, a dummy interconnection segment that is finally removed may previously be disposed around each block as appropriate.

As illustrated in FIG. 3, the layout change information generation step (S308) is repeatedly executed in the decreasing order of the weight added to the undetected bridge fault until the total of weights becomes a predetermined value or less (NO in S309). As a result, the undetected bridge fault is efficiently removed without negatively affecting the layout or timing.

<FIG. 3: S309> When the total of weights of the undetected bridge faults becomes the predetermined value or less (YES in S309), a layout change step (S310) is executed.

<FIG. 3: LAYOUT CHANGE STEP (S310)> In the layout change step (S310), the layout changer 14g actually changes the LSI layout to generate the final layout based on the layout change information 16l generated in the layout change information generation step (S308).

<FIG. 3: BRIDGE FAULT EXTRACTION STEP (S311)> As with the bridge fault extraction step (S303), the bridge fault extraction step (S311) is executed to the final layout generated in the layout change step (S310).

<FIG. 3: BRIDGE FAILURE INCIDENCE RATIO CALCULATION STEP (S312)> In the bridge failure incidence ratio calculation step (S312), the bridge fault extraction unit 14b extracts the bridge fault from the final layout generated in the layout change step (S310). The test pattern generation unit 14c obtains detection information by a fault simulation applying the already-generated test pattern to the extracted bridge fault using the ATPG tool. The weight calculator 14d calculates the bridge failure incidence ratio (evaluated value) and the total of weights of the undetected bridge faults using the weighed bridge fault detection ratio of the final layout and the bridge failure incidence ratio information 16h. The test pattern generator 14c may generate a new test pattern. The weighed bridge fault detection ratio of the final layout and the total of weights of the undetected bridge faults are stored as the weighed bridge fault detection information 16i in the memory 16 along with the list including the weight order of the undetected bridge fault.

As illustrated in FIG. 3, the bridge fault removal operation according to the embodiment of the present invention ends after the bridge failure incidence ratio calculation step (S312).

The above embodiment of the present invention is described only by way of example, and the scope of the present invention is not limited to the embodiment of the present invention. The scope of the present invention is described only by claims, and the scope of the present invention is intended to include meanings equivalent to claims and all the modifications within claims.

According to the embodiment of the present invention, LSI is divided into the plural blocks, the bridge fault in LSI is extracted along with the block layout information 16d, the test pattern 16f that detects the bridge fault in LSI is generated to obtain the pieces of logical value information 16j on all the signals in LSI in each test pattern 16f, and the signal that can be exchanged with the undetected bridge fault signal having the larger weight is selected for all the test patterns 16f by the simple logical calculation. Therefore, the undetected bridge fault can efficiently be removed while the LSI layout is hardly changed. As a result, the bridge failure incidence ratio can efficiently be lowered. The increase in bridge failure incidence ratio becomes the serious problem in LSI manufactured in the microfabrication process that makes further progress in the future. Particularly the embodiment of the present invention is extremely effective in applying to the IDDQ test in which the number of test patterns 16f is strongly limited.

At least a portion of bridge fault removal apparatus 10 according to the above-described embodiments of the present invention may be composed of hardware or software. When at least a portion of the bridge fault removal apparatus 10 is composed of software, a program for executing at least some functions of the bridge fault removal apparatus 10 may be stored in a recording medium, such as a flexible disk or a CD-ROM, and a computer may read and execute the program. The recording medium is not limited to a removable recording medium, such as a magnetic disk or an optical disk, but it may be a fixed recording medium, such as a hard disk or a memory.

In addition, the program for executing at least some functions of the bridge fault removal apparatus 10 according to the above-described embodiment of the present invention may be distributed through a communication line (which includes wireless communication) such as the Internet. In addition, the program may be encoded, modulated, or compressed and then distributed by wired communication or wireless communication such as the Internet. Alternatively, the program may be stored in a recording medium, and the recording medium having the program stored therein may be distributed.

The above-described embodiments of the present invention are just illustrative, but the invention is not limited thereto. The technical scope of the invention is defined by the appended claims, and various changes and modifications of the invention can be made within the scope and meaning equivalent to the claims.

What is claimed is:

1. A bridge fault removal apparatus comprising:
 a bridge fault extraction unit configured to extract a bridge fault from layout information of a semiconductor integrated circuit;
 a test pattern generator configured to generate a test pattern aiming at the bridge fault extracted by the bridge fault extraction unit;
 a logical value information calculator configured to calculate logical value information of signals in the semiconductor integrated circuit by applying the test pattern generated by the test pattern generator to logical connection information of the semiconductor integrated circuit; and
 a bridge fault remover configured to select an exchange signal candidate for removing an undetected bridge fault by physically exchanging an undetected bridge fault signal with the exchange signal candidate, corresponding to the test pattern based on the logical value information calculated by the logical value information calculator, wherein the undetected bridge fault is composed of the undetected bridge fault signals.

2. The apparatus of claim 1, wherein the bridge fault remover is configured to select the exchange signal candidate based on an exclusive OR of the signal in the semiconductor integrated circuit and the undetected bridge fault signal.

3. The apparatus of claim 2, further comprising a layout divider configured to divide the layout information into a plurality of blocks and to generate block layout information with interconnection information in a section of each block,
 wherein the bridge fault extraction unit is configured to extract the bridge fault and an element length of proximity portion of the interconnection signal wires in each proximity distance classification based on the interconnection information in the block layout information generated by the layout divider, and
 the bridge fault remover is configured to use signal information at the sectional surface of a divided block for the selection of the exchange signal candidate.

4. The apparatus of claim 3, further comprising a weight calculator configured to weigh the bridge fault extracted by the bridge fault extraction unit based on the length of proximity portion of the interconnection signal wires of the bridge fault and bridge failure incidence ratio in each proximity distance classification, wherein the bridge fault remover is configured to select a signal satisfying design limitations including a timing limitation of signals comprising the exclusive OR of "1" as the exchange signal candidate for one signal of each undetected bridge fault signal pair in the order of weight of the bridge fault weighed by the weight calculator.

5. A computer-implemented method for removing a bridge fault, the method comprising:
   extracting a bridge fault from layout information of a semiconductor integrated circuit;
   generating the test pattern aiming at the extracted bridge fault;
   calculating logical value information of all the signals in the semiconductor integrated circuit by applying the generated test pattern to logical connection information of the semiconductor integrated circuit; and
   selecting an exchange signal candidate for removing an undetected bridge fault by physically exchanging an undetected bridge fault signal with the exchange signal candidate, corresponding to the test pattern based on the calculated logical value information, wherein the undetected bridge fault is composed of the undetected bridge fault signals.

6. The method of claim 5, wherein in selecting the exchange signal candidate, the exchange signal candidate is selected based on an exclusive OR of the signal in the semiconductor integrated circuit and the undetected bridge fault signal.

7. The method of claim 6, further comprising:
   dividing the layout information into a plurality of blocks; and
   generating block layout information with interconnection information in a section of each block,
   wherein in extracting a bridge fault, the bridge fault and an element length of proximity portion of the interconnection signal wires of the bridge fault in each proximity distance classification are extracted based on the interconnection information in the generated block layout information, and
   in selecting the exchange signal candidate, signal information at the sectional surface of a divided block is used for the selection of the exchange signal candidate.

8. The method of claim 7, further comprising weighing the extracted bridge fault based on the length of proximity of portion of the interconnection signal wires of the bridge fault and bridge failure incidence ratio in each proximity distance classification,
   wherein in selecting the exchange signal candidate, the signal satisfying design limitations including a timing limitation of signals comprising the exclusive OR of "1" is selected as the exchange signal candidate for one signal of each undetected bridge fault signal pair in the order of weight of the weighed bridge fault.

9. A non-transitory computer readable medium comprising a computer program code for removing a bridge fault, the computer program code comprising:
   extracting a bridge fault from layout information of a semiconductor integrated circuit;
   generating the test pattern aiming at the extracted bridge fault;
   calculating logical value information of signals in the semiconductor integrated circuit by applying the generated test pattern to logical connection information of the semiconductor integrated circuit; and
   selecting an exchange signal candidate for removing an undetected bridge fault by physically exchanging an undetected bridge fault signal with the exchange signal candidate, corresponding to the test pattern based on the calculated logical value information, wherein the undetected bridge fault is composed of the undetected bridge fault signals.

10. The medium of claim 9, wherein in selecting the exchange signal candidate, the exchange signal candidate is selected based on an exclusive OR of the signal in the semiconductor integrated circuit and the undetected bridge fault signal.

11. The medium of claim 10, further comprising:
    dividing the layout information into a plurality of blocks; and
    generating block layout information with interconnection information in a section of each block,
    wherein in extracting a bridge fault, the bridge fault and an element length of proximity portion of the interconnection signal wires of the bridge fault in each proximity distance classification are extracted based on the interconnection information in the generated block layout information, and
    in selecting the exchange signal candidate, signal information at the sectional surface of a divided block is used for the selection of the exchange signal candidate.

12. The medium of claim 11, further comprising weighing the extracted bridge fault based on the length of proximity portion of the interconnection signal wires of the bridge fault and bridge failure incidence ratio in each proximity distance classification,
    wherein in selecting the exchange signal candidate, the signal satisfying design limitations including a timing limitation of signals comprising the exclusive OR of "1" is selected as the exchange signal candidate for one signal of each undetected bridge fault signal pair in the order of weight of the weighed bridge fault.

13. The apparatus of claim 1, wherein the bridge fault remover generates layout change information on the detected bridge fault based on the selected exchange signal candidate.

14. The method of claim 5, further comprising generating layout change information on the undetected bridge fault based on the selected exchange signal candidate.

15. The medium of claim 9, further comprising generating layout change information on the undetected bridge fault based on the selected exchange signal candidate.

* * * * *